(12) United States Patent
Haba et al.

(10) Patent No.: US 6,428,328 B2
(45) Date of Patent: *Aug. 6, 2002

(54) METHOD OF MAKING A CONNECTION TO A MICROELECTRONIC ELEMENT

(75) Inventors: Belgacem Haba, Cupertino, CA (US); Anthony B. Faraci, Georgetown, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/977,803

(22) Filed: Oct. 15, 2001

Related U.S. Application Data

(62) Division of application No. 09/590,338, filed on Jun. 8, 2000, which is a division of application No. 09/227,750, filed on Jan. 8, 1999, now Pat. No. 6,200,143.
(60) Provisional application No. 60/071,056, filed on Jan. 9, 1998.

(51) Int. Cl.[7] .............................................. H01R 12/01
(52) U.S. Cl. ........................................ 439/70; 439/342
(58) Field of Search ...................... 439/70, 342, 343; 29/834, 879, 876, 877, 878

(56) References Cited

U.S. PATENT DOCUMENTS

| | | | |
|---|---|---|---|
| 3,670,409 A | 6/1972 | Reimer | 29/853 |
| 4,818,728 A | 4/1989 | Rai et al. | 439/205 |
| 4,893,172 A | 1/1990 | Matsumoto et al. | 357/79 |
| 4,975,079 A | 12/1990 | Beaman | 439/482 |
| 5,006,792 A | 4/1991 | Malhi et al. | 324/158 |
| 5,086,337 A | 2/1992 | Noro et al. | 357/79 |
| 5,196,726 A | 3/1993 | Nishiguchi et al. | 257/737 |
| 5,199,879 A | 4/1993 | Kohn et al. | 439/63 |
| 5,615,824 A | 4/1997 | Fjelstad et al. | 228/180.1 |
| 5,802,699 A | 9/1998 | Fjelstad et al. | 29/593 |
| 5,880,590 A | 3/1999 | Desai et al. | 324/757 |
| 5,984,691 A | 11/1999 | Brodsky et al. | 439/66 |

OTHER PUBLICATIONS

Nolan, et al., A Tab Tape–Based Bare Chip Test and Burn Carrier, 1994 ITAP and Flip Chip Proceedings, pp. 173–179.

*Primary Examiner*—Tulsidas Patel
(74) *Attorney, Agent, or Firm*—Lerner, David, Littenberg, Krumholz & Mentlik, LLP

(57) ABSTRACT

A connector for microelectronic elements includes a sheet-like dielectric layer having a plurality of through holes desirably arranged in a rectangular grid pattern. Each hole is provided on one major surface with a generally laminar contact having at least one projection extending inwardly over the through hole. Contact pads on the second major surface of the dielectric layer overlie the through holes to provide a blind end which is electrically connected to the other contact by means of a metal layer lining the through hole. The resulting connectors provide low or zero insertion force sockets for mounting microelectronic elements having bump leads thereto. The bump leads may be received within corresponding sockets without engagement with the contact or projection, and then, by movement in a lateral direction, engaging the contact or projection to provide electrical connection to the socket.

31 Claims, 10 Drawing Sheets

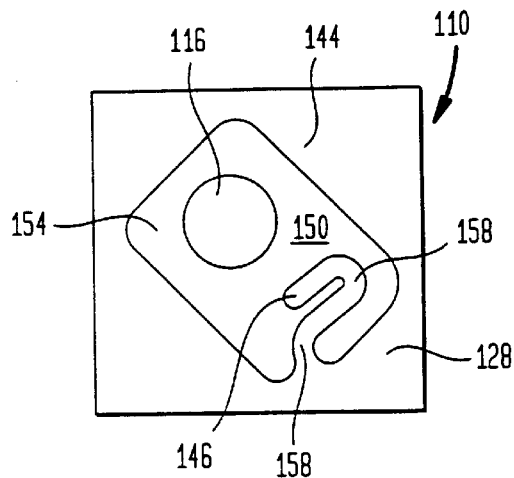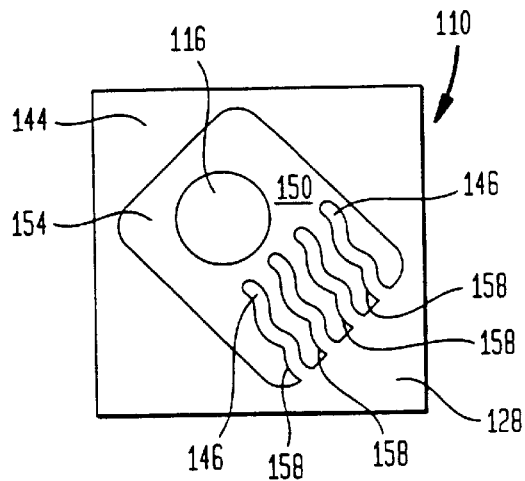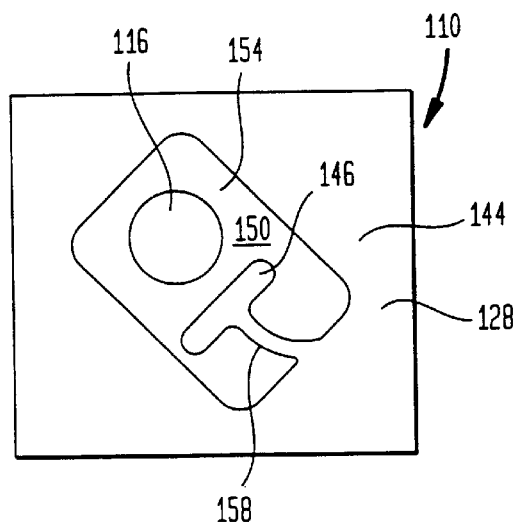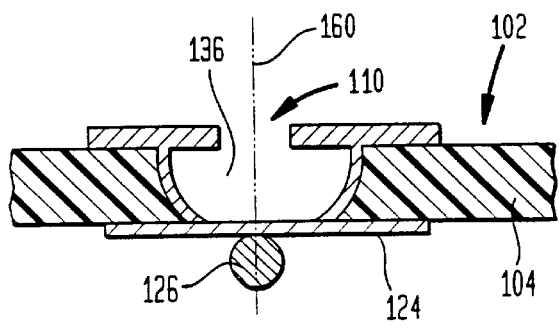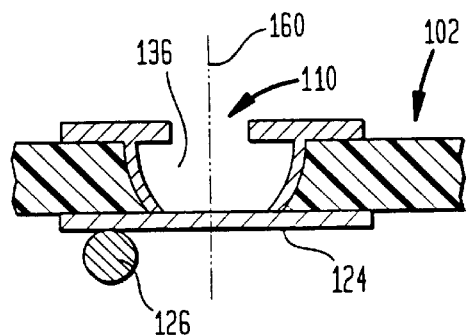

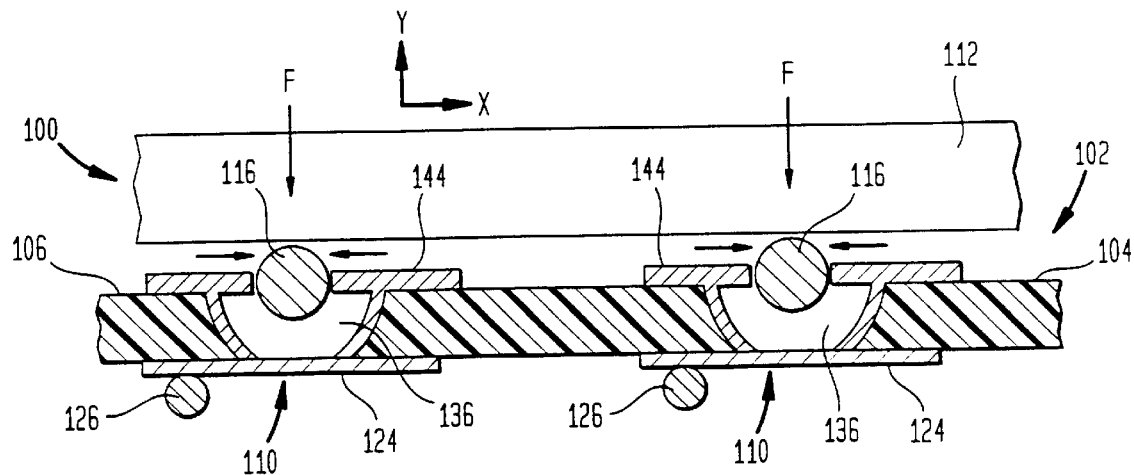
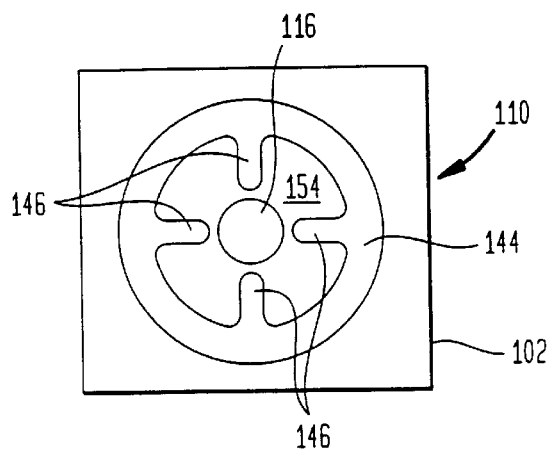
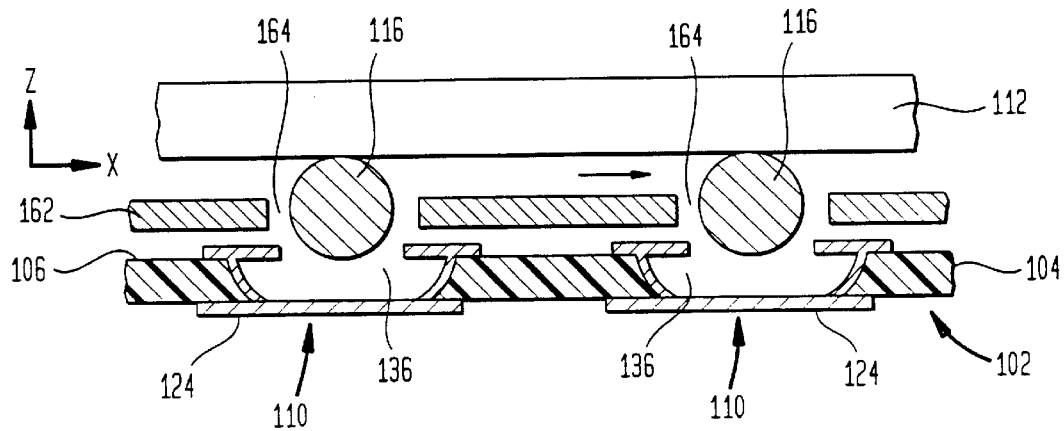

METHOD OF MAKING A CONNECTION TO A MICROELECTRONIC ELEMENT

CROSS-REFERENCE TO RELATED APPLICATIONS

This application is a divisional application of U.S. patent application Ser. No. 09/590,338 filed Jun. 8, 2000, which is a divisional application of U.S. patent application Ser. No. 09/227,750, filed on Jan. 8, 1999, now U.S. Pat. No. 6,200,143, which claim the benefit of U.S. Provisional Application Ser. No. 60/071,056, filed Jan. 9, 1998, the disclosures of which is hereby incorporated by reference herein.

BACKGROUND OF THE INVENTION

The present invention relates in general to connectors useful for mounting microelectronic elements and related electronic components, to assemblies made using such connectors and to methods of making such connectors and assemblies, and more particularly, to such connectors having sockets providing low or zero insertion force connection to microelectronic elements and related electronic components.

Modern electronic devices utilize microelectronic elements which include semiconductor chips, commonly referred to as "integrated circuits", which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board. Alternatively, in a "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first and second level connections must accommodate all of the required electrical interconnections to the chip. The number of connections to external circuit elements, commonly referred to as "input-output" connections, is determined by the structure and function of the chip. Advanced chips capable of performing numerous functions may require substantial numbers of input-output connections. Accordingly, the size of the chip and substrate assembly is a major concern. The size of each such assembly influences the size of the overall electronic device. More compact assemblies, with smaller distances between chips provide smaller signal transmission delays and hence permit faster operation of the device.

At present, one widely utilized interconnection method is known as flip-chip bonding. In flip-chip bonding, contacts on the front surface of the chip are provided with bump leads such as balls of solder protruding from the front surface of the chip. The substrate has contact pads arranged in an array corresponding to the array of contacts on the chip. The chip, with the solder bump leads, is inverted so that its front surface faces toward the top surface of the substrate, with each contact and solder bump lead on the chip being positioned on the appropriate contact pad of the substrate. The assembly is then heated to liquefy the solder and bond each contact on the chip to the confronting contact pad of the substrate.

Because the flip-chip arrangement does not require leads arranged in a fan-out pattern, it provides a compact assembly. The area of the substrate occupied by the contact pads is approximately the same size as the chip itself. Moreover, in flip-chip bonding, the contacts on the chip may be arranged in a so-called "area array" covering substantially the entire front face of the chip. Flip-chip bonding is well suited for use with chips having large numbers of input-output contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips.

One solution has been the use of sockets or spring-like contacts to connect the solder bump leads to the substrate. As microelectronic chips have decreased in size, the pitch of the solder bump lead interconnections has become finer, requiring a finer pitch on mating sockets. At the same time, the mating sockets must still compensate for pitch error and height error in the solder bump leads on the chip. Such accommodation for solder bump lead location tolerances becomes increasingly more difficult as the sockets are more tightly packed in a connector.

U.S. Pat. Nos. 5,802,699 and 6,086,386, both assigned to the same assignees as the present application and hereby incorporated by reference herein, disclose sockets having metallic projections arranged circumferentially around a hole for receiving a bump lead. The metallic projections deflect as the solder bump lead is urged into the hole.

Kohn, et al., U.S. Pat. No. 5,199,879 discloses a pin socket having a plurality of deflectable tabs projecting at least partially across an opening. Matsumoto, et al., U.S. Pat. No. 4,893,172 and Noro, et al., U.S. Pat. No. 5,086,337, disclose variants of the flip-chip approach using flexible spring-like elements connected between a chip and a substrate.

Nishiguchi, et al., U.S. Pat. No. 5,196,726 discloses a variant of the flip-chip approach in which non-meltable bump leads on the face of the chip are received in a cup-like sockets on the substrate and bonded therein by a low-melting point material. Beaman, U.S. Pat. No. 4,975,079 discloses a test socket for chips in which dome-shaped contacts on the test substrate are disposed within conical guides. The chip is forced against the substrate so that the solder balls enter the conical guides and engage the dome-shaped pins on the substrate. Enough force is applied so that the dome-shaped pins actually deform the solder balls of the chip.

Rai, et al., U.S. Pat. No. 4,818,728 discloses a first substrate such as a chip with studs or bump leads protruding outwardly and a second substrate with recesses having solder for engaging the bump leads. Malhi, et al., U.S. Pat. No. 5,006,792 discloses a test socket in which a substrate has an exterior ring-like structure and numerous cantilever beams protruding inwardly from the ring-like structure. Contacts are disposed on these cantilever beams so that the same can be resiliently engaged with contacts of a chip when the chip is placed in the socket. Nolan, et al., A Tab Tape-Based Bare Chip Test and Burn Carrier, 1994 ITAP And Flip Chip Proceedings, pp. 173–179 discloses another socket with cantilevered contact fingers for engaging the contacts on a chip; in this case the contact fingers are formed on a flexible tab tape and reinforced by a silicone material so as to provide forcible engagement and a wiping action with the chip contact.

Despite all of these efforts in the art, however, there have still been needs for improved connectors for connecting microelectronic elements and other related electronic components suitable for use in providing first and second level interconnection in the making of modern electronic devices. More particularly, there is an unsolved need for such connectors which include sockets for receiving solder bump leads for electrical connection thereto using low or zero insertion force to prevent any possible damage to the microelectronic element.

SUMMARY OF THE INVENTION

The present invention discloses the formation of socket-like structures on a support such as a dielectric sheetlike layer having top and bottom surfaces, and further including patterned metallic layers on the top and bottom surfaces. The resulting two-sided metal laminate may be formed by adhering metal foil to both sides of a dielectric layer, or may be formed by plating or sputtering a metal to both sides of the dielectric layer.

One process for forming a socket-like structure using the two-sided laminate includes initially etching an opening in the top metal layer. The dielectric layer is then etched through the opening typically using a plasma etching process or a laser etching process to provide a through hole. The etching process undercuts the top metal layer in a region surrounding the opening. The exposed dielectric in the through hole is seeded and plated to form a metal layer within the hole connecting the top and bottom metal layers. Finally, the top and bottom metal layers are patterned etched to form the remaining features of the circuit patterns, such as circuit traces, terminals, contact pads and the like.

The resulting socket-like structure has one or more protruding metal tabs or tines on the top surface of the dielectric layer connected to a metal lower feature on the bottom surface of the dielectric layer by the metal layer lining the through hole. The metal tabs or tines overhang the through hole and can deflect with respect to each other and with respect to the lower feature.

The socket-like structure may be used as a side-contact, or zero insertion force socket having a very fine pitch. In one embodiment, the opening in the top metal layer defines one or more tabs or tines and a central clearance region for a solder ball to be inserted. The tabs or tines are connected to the surrounding top metal layer at points near the region where the solder ball is to be inserted, and extend away from the solder ball while extending toward each other as they extend away from their points of attachment. In another embodiment of the present invention, the tabs or tines are attached to the surrounding top metal layer at points remote from the region where the solder ball is inserted, and likewise extend away from each other from their points of attachment.

In either embodiment, the solder ball is freely inserted with zero insertion force into the through hole through the opening in the top metal layer, and then moved laterally towards the tabs or tines. Upon contact with the tabs or tines, the solder ball separates the tabs or tines and wipes against them, scraping away any oxide coating on the tabs or tines and/or the solder ball, and exposing unoxidized metal beneath.

A connector including at least one and preferably a plurality of low or zero insertion force sockets can be used for mounting a microelectronic element to a substrate, such as another microelectronic element and the like. A microelectronic element having an array of solder balls is juxtaposed with a connector having a plurality of sockets arranged in a corresponding array. In accordance with one embodiment, applying a downward force on the microelectronic element forces the solder ball array downward into the corresponding sockets, and causes the dielectric layer of the connector to be deflected downward between lower solder balls that are supporting the connector and which are used to connect the lower features, e.g., contact pads, on the bottom surface of the dielectric layer with the underlying substrate. Such an arrangement wherein a sheetlike member is supported by and deflects between an array of lower solder balls is described in the aforementioned U.S. Pat. No. 6,086,386.

As the dielectric layer is deflected downward between the lower solder balls, the upper surface of the dielectric layer is compressed, forcing the upper features, e.g., metal contacts, surrounding the sockets to close on the solder balls of the microelectronic element, thereby making contact with the solder ball array.

In accordance with another embodiment of the present invention, the microelectronic element is moved downward so that the solder balls of the solder ball array enter the corresponding array of sockets. A lateral force is then applied to the microelectronic element in order to move the solder ball array with respect to the array of sockets, thereby making contact between each solder ball and one or more of the tabs or tines of each socket. A spacer having holes corresponding to the solder ball array may be used between the microelectronic element and the connector.

In another embodiment of a socket having radially inwardly extending upper features such as tabs or tines, the solder balls of the solder ball array may be larger than the space between the tabs or tines, so that contact is made upon insertion of the solder balls into the sockets. This arrangement may also be combined with a deflectable dielectric layer in order to close the tabs or tines on the solder balls after insertion due to deflection of the dielectric layer and compression of the top layer of the connector. Various patterns of the metal contact pads formed from the top metal layer may be used to enhance the compression of the top layer of the connector in order to cause the tabs or tines to move radially inward and contact the solder balls.

In accordance with another embodiment of the present invention there is described a connector for mounting a microelectronic element thereto, the connector comprising a sheetlike body having a first major surface for facing the microelectronic element and a second major surface, the body including at least one hole extending between the first and second major surfaces, a generally laminar first contact secured to the first major surface of the body having an opening in registration with the hole, the first contact including at least one projection overlying a portion of the hole, the opening constructed for receiving a bump lead on the microelectronic element without engagement with the projection, whereby a microelectronic element can be mounted to the connector by superimposing the microelectronic element on the first major surface of the body so that the bump lead protrudes through the opening into the hole and upon lateral movement of the bump lead within the hole engages the projection for electrical connection thereto.

In accordance with another embodiment of the present invention there is described an electronic assembly comprising a connector as previously constructed, and a microelectronic element having at least one bump lead protruding therefrom and extending into the hole within the body, the microelectronic element being mounted on the first major surface of the connector upon lateral movement of the bump lead within the hole into engagement with the projection for electrical connection thereto.

In accordance with another embodiment of the present invention there is described a method of making connection to a microelectronic element having at least one bump lead thereon, the method comprising the steps of superimposing the microelectronic element on a top surface of a sheetlike body having at least one hole receiving the bump lead therein, the body including a projection secured to the surface of the body and extending overlying a portion of the hole, and displacing the bump lead laterally within the hole into engagement with the projection.

In accordance with another embodiment of the present invention there is described a connector for mounting a microelectronic element to a substrate, the connector comprising a sheetlike dielectric body having a first major surface for facing the microelectronic element and a second major surface for facing the substrate, the body including a plurality of holes extending between the first and second major surfaces arranged in an array corresponding to an array of bump leads on the microelectronic element, an array of generally laminar first contacts secured to the first major surface of the body each having an opening in registration with a corresponding one of the holes, each of the first contacts including at least one sheetlike projection overlying a portion of a corresponding one of the holes, an array of generally laminar second contacts secured to the second major surface of the body in registration with and overlying the holes, the second contacts forming the holes within a blind end adjacent the second major surface of the body, and a conductive layer lining the interior walls of the holes between the first and second contacts, whereby a microelectronic element can be connected to the substrate by superimposing the microelectronic element on the first major surface of the body so that the bump leads on the microelectronic element protrude into the holes for electrical connection to the projection and by connecting the second contacts with conductive elements on the substrate.

In accordance with another embodiment of the present invention there is described an electronic assembly comprising a connector as previously constructed, and a microelectronic element having a plurality of bump leads protruding therefrom arranged in an array corresponding to the array of the holes, the microelectronic element being mounted on the first major surface of the connector such that the bump leads protrude into the holes within the body and are connected to the projection.

In accordance with another embodiment of the present invention there is described a method of making connection to a microelectronic element having an array of bump leads thereon, said method comprising the steps of providing a connector as previously constructed, superimposing the microelectronic element on the first major surface of the body with the bump leads being received in corresponding ones of the holes, and displacing the bump leads laterally within the holes into engagement with a corresponding one of the projections for electrical connection thereto.

BRIEF DESCRIPTION OF THE DRAWINGS

The above description, as well as further objects, features and advantages of the present invention will be more fully understood with reference to the following detailed description of a low insertion force connector for microelectronic elements, when taken in conjunction with the accompanying drawings, wherein:

FIG. 13 is a top plan view showing a socket having a springlike tab or tine constructed in accordance with another embodiment of the present invention.

FIG. 14 is a top plan view showing a socket having a plurality of springlike tabs or tines constructed in accordance with another embodiment of the present invention.

FIG. 15 is a top plan view showing a socket having a springlike tab or tine constructed in accordance with still another embodiment of the present invention.

FIG. 16 is a fragmentary sectional view showing a socket supported by a bump lead or solder ball aligned with the central axis of the socket in accordance with one embodiment of the present invention.

FIG. 17 is a fragmentary sectional view showing a socket supported by a bump lead or solder ball offset from the central axis of the socket in accordance with another embodiment of the present invention.

FIG. 18 is a fragmentary sectional view showing a microelectronic element mounted to a connector via the socket of FIG. 17.

FIG. 19 is a top plan view showing a socket constructed in accordance with another embodiment of the present invention.

FIG. 20 is a fragmentary sectional view showing a microelectronic element mounted to a connector via the socket of FIG. 19.

DETAILED DESCRIPTION

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
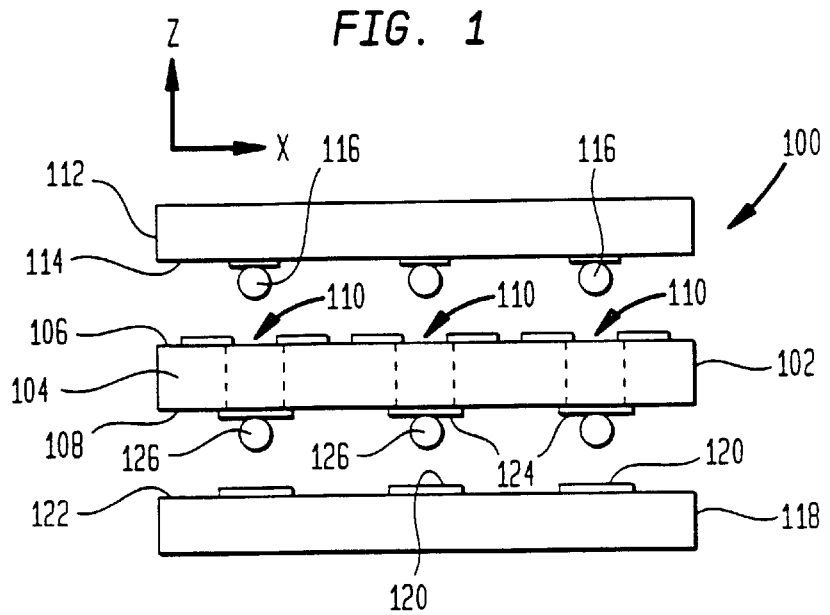
FIG. 1 is a diagrammatic front elevational view of an electronic assembly including a microelectronic element mounted to a substrate by means of a connector having an array of sockets constructed in accordance with the present invention.

Referring now to the drawings, wherein like reference numerals represent like elements, there is shown in FIG. 1 a diagrammatic illustration of an electronic assembly generally designated by reference numeral 100. The assembly 100 includes a connector 102 constructed in accordance with the present invention. Briefly, as to be described hereinafter in greater detail, the connector 102 includes a sheetlike dielectric layer 104 having a top major surface 106 and an opposing bottom major surface 108. A plurality of sockets 110 constructed in accordance with the present invention are arranged in the dielectric layer 104 in a predetermined array.

The connector 102 is operative by means of the sockets 110 for connecting or mounting one or more microelectronic elements 112 overlying the top major surface 106. The microelectronic element 112 may be in the nature of a semiconductor chip, semiconductor chip package, a cable plug or other electronic element as is well known in the integrated circuit and semiconductor art. The microelectronic element 112 supports on its bottom surface 114 a plurality of bump leads or solder balls 116 arranged in an array corresponding to the terminals or contact pads providing connection to the circuitry within the microelectronic element. As should be apparent, the array of sockets 110 in the connector 112 are arranged to conform to the array of the bump leads 116 of the microelectronic element 112. By mating the microelectronic element 112 with the top major surface 116 of the connector 102, the bump leads 116 will be received within the aligned sockets 110 so as to provide connection therebetween as to be described hereinafter. In this regard, the connecting of the microelectronic element 112 to the connector 102 will generally be characterized as a low or zero force insertion connection by virtue of the construction of the sockets 110 to be described.

The connector 102 is also suitable for connection to a substrate 118 which may also be in the form of one or more microelectronic elements 112 or other such electronic elements. The substrate 118 is provided with a plurality of electrically conductive contacts 120 arranged in an array on the top surface 122 of the substrate. The sockets 110 on the bottom major surface 108 of the dielectric layer 104 are provided with a corresponding array of generally laminar electrically conductive contacts 124 which optionally support a bump lead or solder ball 126 which is operative for bonding to generally laminar contacts 120 on the top surface 122 of the substrate 118. The connector 102 is operative for mounting one or more microelectronic elements 112 to the connector by means of the sockets 110.

Figure 2:
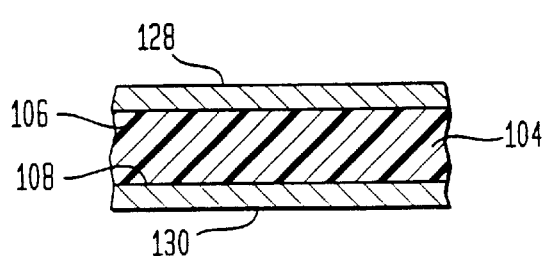
FIGS. 2 through 6 are sequential fragmentary sectional views showing the fabrication of a socket constructed in accordance with one embodiment of the present invention.

Turning now to FIGS. 2 through 6, there will be described in accordance with one embodiment of the present invention the construction of a connector 102 having one or more sockets 110. The connector 102 includes a sheetlike dielectric layer 104 having a top major surface 106 generally facing upwardly and a bottom major surface 108 generally facing downwardly. Depending upon the thickness and material selection for the dielectric layer 104, the connector may be either flexible or rigid in nature. In accordance with the preferred embodiment, the dielectric layer 104 is a polyimide layer having a thickness in the range of about 25 to 75 microns. The major surfaces 106, 108 of the dielectric layer 104 are laminated with a corresponding top metal layer 128 and a bottom metal layer 130. The metal layers 128, 130 may be formed as metal foils which are adhered to the dielectric layer 104, or may be formed by plating or sputtering a metal to both major surfaces of the dielectric layer. In a preferred embodiment, the metal layers 128, 130 are formed from copper having a thickness in the range of about 10 to 30 microns. As thus far described in the process of forming the connector 102, the structure as shown in FIG. 2 is in the nature of a two-sided metallic laminate having a central sheetlike dielectric layer.

Figure 3:
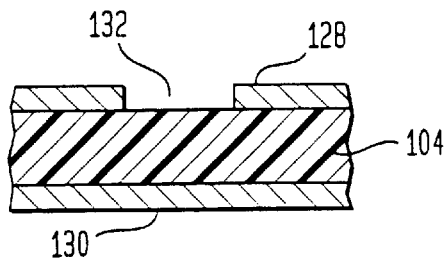

An opening 132 is etched into the top metal layer 128 using any suitable means, such as patterned photolithographic techniques followed by chemical etching of the metal layer 128. The particular size and shape of the opening 132 will be described and understood from the following description of the present invention. However, it is to be understood that by virtue of using photolithographic techniques, any size and shape opening 132 can be provided in the metal layer 128. Although only one opening 132 is shown in FIG. 3, it is to be understood that generally a plurality of openings will be formed within the top metal layer 128 in an array or other pattern corresponding to the array or pattern of the bump leads 116 provided on the microelectronic element 112 to be mounted.

Figure 4:
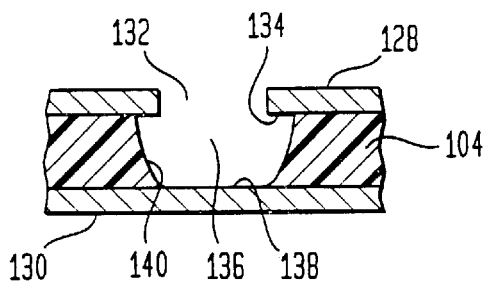

As shown in FIG. 4, using the top metal layer 128 as a mask, or providing another suitable mask such as photoresist (not shown), the dielectric layer 104 is etched using a plasma etching process which etches the dielectric layer isotropically. As a result, the etching process undercuts the top metal layer 128 in the region 134 surrounding the opening 132 to provide an overhang of the top metal layer. It is also contemplated that the dielectric layer 104 may be ablated using a laser etching process followed by plasma or wet chemical etching to achieve the undercut desired in the region 134. In the case of laser etching, the undercutting of the top metal layer 128 is narrower than in the case of etching using plasma etching along. In either event, the etching process is continued until the dielectric layer 104 is removed so as to form a through hole 136 which exposes the inner surface 138 of the bottom metal layer 130.

Figure 5:
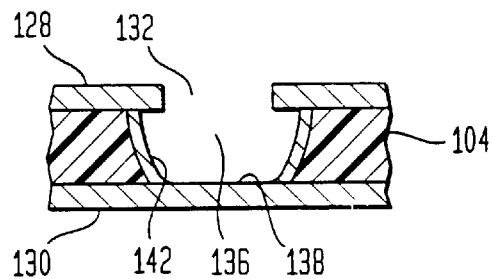

The exposed surfaces 140 of the dielectric layer 104 surrounding the through hole 136 are seeded with a suitable seeding solution which is known for electroless and/or electroplating of dielectric materials. The seeded surfaces 140 are subjected to electroless and/or electroplating to form a continuous metal layer 142 within the through hole 136 which provides electrical continuity between the top and bottom metal layers 128, 130. The resulting structure of the connector 102 is shown in FIG. 5.

Figure 6:
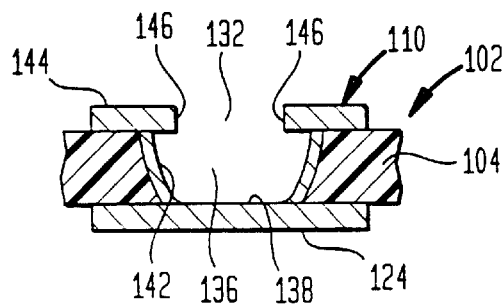

The connector 102 and sockets 110 are completed as shown in FIG. 6 by patterning the top and bottom metal layers 128, 130 such as by using photolithographic techniques to delineate the top and bottom generally laminar electrically conductive contacts 144, 124 associated with each socket 110, as well as providing the remaining conductive features of the circuit patterns such as circuit traces, terminals, contact pads and the like. The connector 102 by virtue of the bottom contacts 124 being arranged in alignment with and underlying the through holes 136, and hence the bump leads 116 of the microelectronics 112, is suitable for providing sockets 110 arranged in a high density as required for microelectronic elements 112 having a corresponding high density of electrical elements which require connection. In addition, the construction of the sockets 110 do not require rerouting of the electrical continuity from the top contacts 144 to the bottom contacts 124.

The completed connector 102, as shown in FIG. 6 has one or more metal projections in the form of tabs or tines 146 formed from the top contacts 144 on the top major surface 106 of the dielectric layer 104. The tabs or tines 146 are electrically connected to the underlying and aligned bottom contacts 124 by means of the metal layer 142 which lines the through holes 136. The tabs or tines 146 extend inwardly into the opening 132 overlying the through hole 136. The tabs or tines 146 may be constructed as various shapes and sizes as to be described. This is accomplished during the patterning of the top metal layer 128. The tabs or tines 146 can be deflected, either upwardly or downwardly, independently with respect to each other and with respect to the bottom contact 124. The sockets 110 are therefore particularly suitable for use in connection to bump leads or solder balls 116 such as those generally employed with microelectronic elements 112 as previously described.

The connector 102 via the sockets 110 may be used to form a side-contact or zero insertion force socket having a very fine pitch. In this regard, a microelectronic element 112 to be mounted to a connector 102 does not require a downward force against the connector to enable all of the bump leads or solder balls 116 to touch or be engaged by the underlying sockets 110. Rather, in accordance with one embodiment of the present invention as to be described, connection between the bump leads or solder balls 116 in electrical continuity with the sockets 110 is achieved by using a lateral force, as opposed to a downward force. In the prior known connectors where a downward force is required, the underlying socket surface or contact projections are required to be flexible to absorb any error in the bump lead diameter and its position on the microelectronic element. This is generally made possible using a high degree of engineering of the socket configuration which has limitations when the pitch size gets smaller as required for high density microelectronic elements. As such, in accordance with one embodiment of the present invention, the connector 102 does not require vertical flexibility of the socket 110 to provide sockets having a high pitched density.

Figure 7:
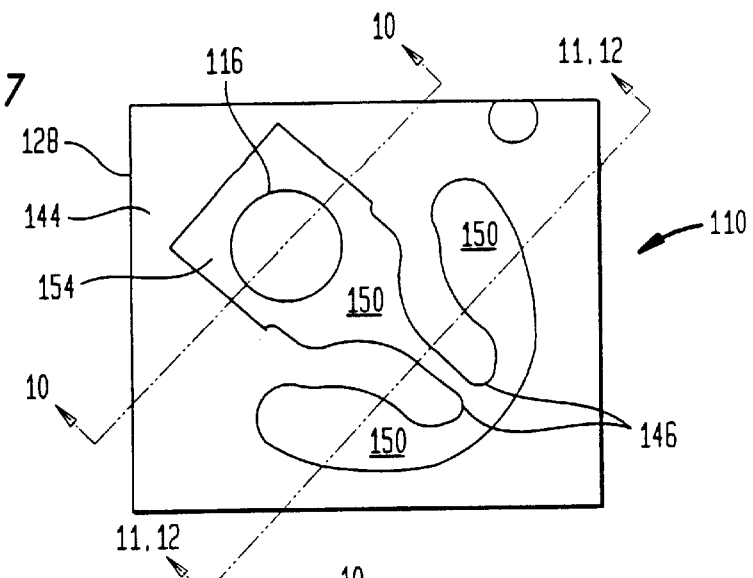
FIG. 7 is a top plan view of a low or zero insertion force socket having a pair of tabs or tines in accordance with one embodiment of the present invention.
Figure 8:
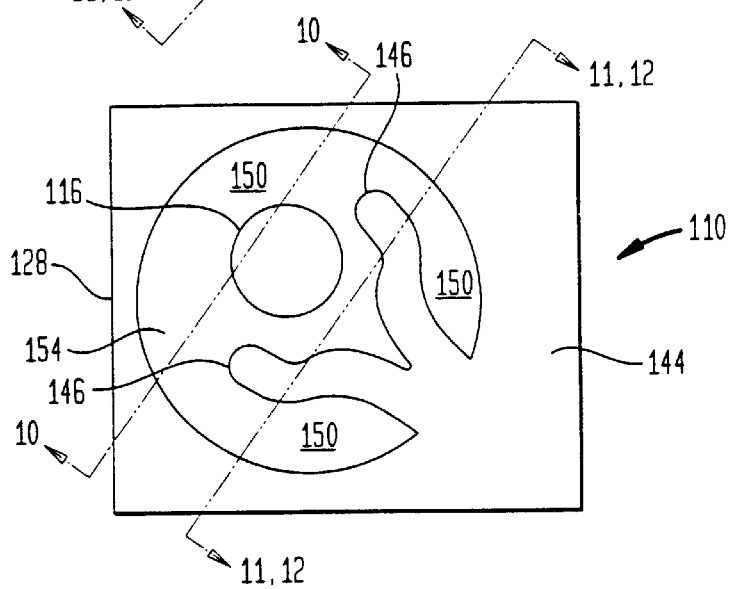
FIG. 8 is a top plan view of a low or zero insertion socket having a pair of tabs or tines in accordance with another embodiment of the present invention.

Referring now to FIG. 7, a zero insertion force socket 110 in accordance with one embodiment of the present invention is shown in plan view. The socket 110 is provided with a patterned opening 150 in the top metal layer 128 of such configuration to define a contact 144 having two tabs or tines 146 and a central opening 154 for receiving a bump lead or solder ball 116 therein. The tabs or tines 146 are connected to the top metal layer 128 at locations near the central opening 154 where the bump leads or solder balls 116 are to be inserted, and extend away from the central opening. The free ends of the tabs or tines 146 merge towards each other as they extend away from their location of connection to the top metal layer 128 adjacent the central opening 154. In another embodiment of a zero insertion force socket 110 as shown in FIG. 8 in plan view, the tabs or tines 146 are attached to the surrounding top metal layer 128 at locations remote from the central opening 154 where the bump lead or solder ball 116 is inserted and extend away from each other from their points of attachment to the top metal layer. In this regard, unlike the tabs or tines 146 as shown in FIG. 7, the tabs or tines shown in FIG. 8 have their free ends diverging outwardly while their attached ends to the top metal layer 128 are proximate each other.

In either embodiment of the zero insertion force sockets 110, the bump lead or solder ball 116 is inserted into the central opening 154 corresponding to the through hole 136 without any downward force in the Z-direction as designated in FIG. 1. This is accomplished by the bump leads or solder balls 116 being smaller in size, e.g., effective diameter, then the size, e.g., effective diameter, of the central openings 154 within the sockets 110. Once the bump leads or solder balls 116 have been received within their respective sockets 110, they are moved laterally in the X-direction such as shown in FIG. 1 so as to engage the tabs or tines 146. Upon engagement with the tabs or tines 146, the bump leads or solder balls 116 separate the tabs or tines while wiping against them, thereby scraping away any oxide coating on the tabs or tines and/or the bump leads or solder balls so as to expose unoxidized metal. In accordance with the preferred embodiment, the tabs or tines 146 may be coated with a nonoxidizing metal layer such as gold or other precious metal. As should be appreciated, the tabs or tines 146 will generally be of the same thickness as the top metal layer 128, and may have a length in the range of about 50 microns or up to about twice the diameter of the bump lead or solder ball 116 which is to be inserted into the through hole 136.

Figure 9:
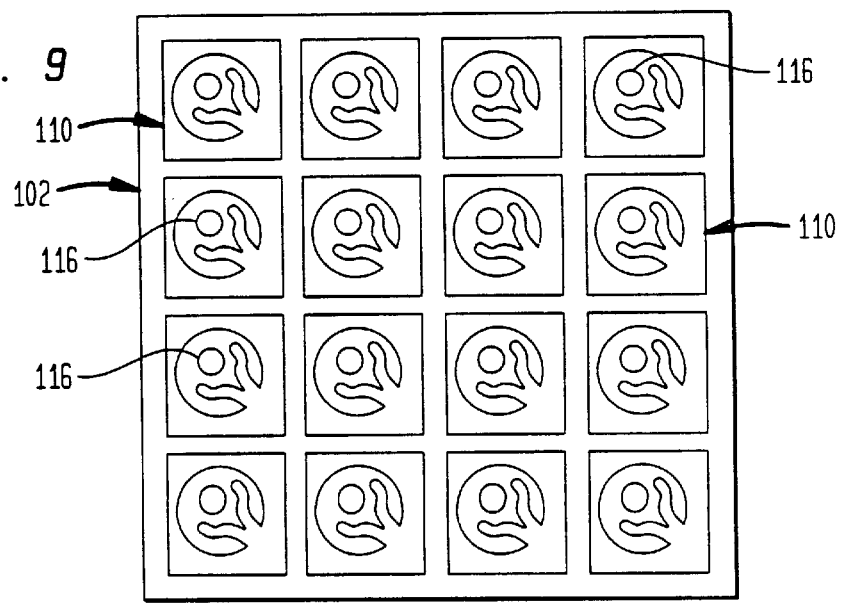
FIG. 9 is a top plan view of a regular grid pattern of sockets as shown in FIG. 8 corresponding to a grid pattern of bump leads on a microelectronic element.

The zero insertion force sockets 110 due to their simple configuration and construction allow for their fabrication by photolithographic techniques in extremely fine pitches, for example, in the order of 0.75 to 0.5 mm or smaller. As shown in FIG. 9, the sockets 110 may be arranged in a grid array so as to correspond to the grid array of the bump leads or solder balls 116 provided on the microelectronic element 112. Accordingly, any desired pattern of the array of the sockets 110 can be achieved using the aforementioned photolithographic techniques, while at the same time providing extremely fine pitches as may be mandated by the particular microelectronic element 112 being mounted to the connector 102.

Figure 10:
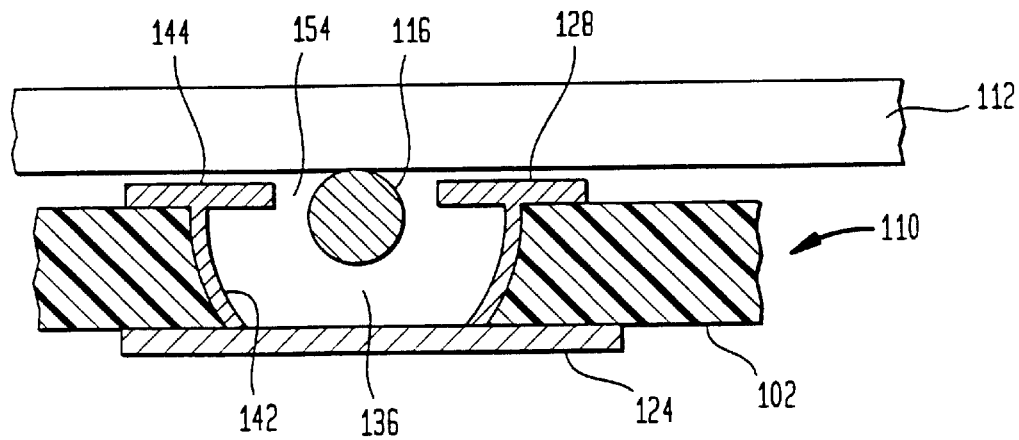
FIG. 10 is a fragmentary sectional view taken along lines 10—10 in FIGS. 7 and 8.
Figure 11:
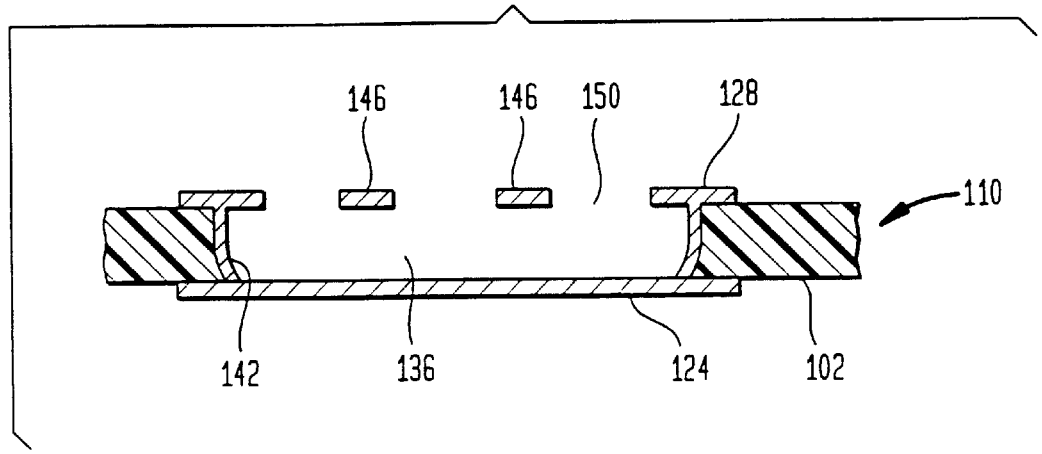
FIG. 11 is a fragmentary sectional view taken along lines 11—11 in FIGS. 7 and 8.
Figure 12:
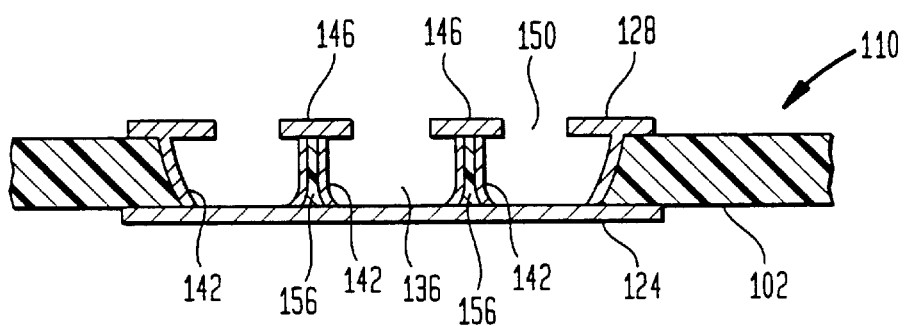
FIG. 12 is a fragmentary sectional view taken along lines 12—12 in FIGS. 7 and 8 showing another embodiment of a socket.

Turning now to FIGS. 10 through 12, there is shown further details of the construction of the zero insertion force sockets 110. In this regard, FIG. 10 is a cross-sectional view of the zero insertion sockets 110 taken through the central opening 154 or bump lead entry area as defined by dashed lines 10—10 in FIGS. 7 and 8. As shown in FIG. 10, the top metal layer 128 surrounding the central opening 154 overhangs the through hole 136 and is electrically connected to the bottom contact 124 by the metal layer 142 lining the through hole. As clearly shown, the effective size of the bump lead or solder ball 116 is such to be received within the through hole 136 through the central opening 154 with zero insertion force without engaging the surrounding contact 144 or projecting tabs or tines 152.

Referring to FIGS. 11 and 12, there is shown two alternative embodiments, in cross-section, of the zero insertion force sockets 110 shown in FIGS. 7 and 8 taken through the tabs or tines 146 designated by dashed lines 11—11 and 12—12. In the embodiment shown in FIG. 11, the tabs or tines 146 are not connected to the bottom contacts 124 formed from the bottom metal layer 130. Rather, the dielectric layer 102 beneath the tabs or tines 146 has been removed during the plasma etching process as described above. As a result, the tabs or tines 146 may be deflected downwardly into the opening 150 with a relatively low lateral force, e.g., in the X-direction, applied between the bump leads or solder balls 116 and the tabs or tines when mounting a microelectronic element 112 thereto.

In the alternative embodiment of the zero insertion force socket 110 as shown in FIG. 12, the tabs or tines 146 are connected to the bottom contacts 124 formed from the bottom metal layer 130 by ribs 156 formed from the dielectric layer 102 left behind during the partial isotropic plasma etching process. The ribs 156 which support the tabs or tines 146 may be seeded and plated if desired, but not required, to provide the metal layer 142 at the same time as the exposed surfaces 140 surrounding the through hole 136 are plated. The tabs or tines 146 which are supported by the ribs 156 require a greater lateral force between the bump leads or solder balls 116 than the previously described tabs or tines in order to deflect same, as the ribs must also be similarly deflected. Thus, the resilience of the tabs or tines 146 is improved over the tabs or tines which are freely suspended in FIG. 11. This construction of the zero insertion force sockets 110 provides an improvement in very fine pitch sockets where the features of the tabs or tines 152 are extremely small and delicate. The tabs or tines 146 resist plastic defamation, and may be reused more readily than the freely suspended tabs or tines as shown in FIG. 11.

As previously described, the tabs or tines 146 may be patterned into a variety of shapes and sizes so as to provide zero insertion force sockets 110. By way of illustration, there is shown in FIGS. 13 through 15 three alternative embodiments of a zero insertion force socket 110. The tabs or tines 146 may be constructed in a similar manner to those described in FIGS. 11 and 12, i.e., either being supported or unsupported by a rib 156. As shown, the tabs or tines 146 are formed in the nature of springlike contact elements which will generally have a lateral deflection when engaged by a bump lead or solder ball 116, i.e., in the X-direction, although a downward deflection, i.e., in the Z-direction is also possible.

As shown in FIG. 13, the tab or tine 146 is in the nature of a generally S-shaped element having bends 158 which facilitate the springlike action provided by the tab or tine. In the embodiment shown in FIG. 14, a plurality of tabs or tines 146 are in the nature of elongated elements having a plurality of bends 158 to provide the springlike properties. In the embodiment disclosed in FIG. 15, the tab or tine 146 has a generally T-shape similarly provided with a bend 158 to provide the springlike properties. As previously noted, the tabs or tines 146 may be supported by an underlying dielectric rib 156 which may or may not be plated with a conductive metal layer 142 which would connect the tab or tine to the lower metal layer 130 and hence to the bottom contact 124.

In FIGS. 16 and 17 there is shown two alternative embodiments for supporting the sockets 110 by means of a bump lead or solder ball 126 provided on the bottom contacts 124. As previously described, bump leads or solder balls 126 are typically used to connect the bottom contacts 124 formed on the bottom major surface 108 of dielectric layer 104 with the contacts 120 provided on the underlying substrate 118. In the embodiment disclosed in FIG. 16, the bump lead or solder ball 126 is centrally located generally in alignment with the central axis 160 of the through hole 136. In the embodiment disclosed in FIG. 17, the bump lead or solder ball 126 is positioned off center, to one side or the other, of the central axis 160.

An electronic assembly 100 in which the bump leads or solder balls 126 attach to the bottom contacts 124 are offset from the central axis 160 of the through holes 136 is shown in FIG. 18. Although the electronic assembly is shown having two sockets 110, it is to be understood that a plurality of zero insertion force sockets arranged in an array may be provided. The microelectronic element 112 is juxtaposed the top major surface 106 of the connector 102 with the bump leads or solder balls 116 received within the corresponding through holes 136 of the respective sockets 110. By virtue of the construction of the zero insertion force sockets 110, the bump leads or solder balls 116 have yet to engage the top contacts 144 which overhang the through hole 136 or the tabs or tines 146. By applying a downward force F on the microelectronic element 112, the bump leads or solder balls 116 are forced against the underlying sockets 110 which causes the dielectric layer 104 of the connector 102 to be deflected downwardly between the supporting bump leads or solder balls 126 provided on the bottom contacts 124 which are supporting the electronic assembly 100. Such an arrangement wherein a sheetlike member is supported by and deflects between an array of bump leads or solder balls is described in the aforementioned U.S. patent application Ser. No. 08/862,151.

As the dielectric layer 102 is deflected downwardly between the bump leads or solder balls 126, the upper surface of the dielectric layer is compressed forcing the top contacts 144 surrounding the through hole 136 to close inwardly on the bump leads or solder balls 116 of the microelectronic element 112 thereby making contact. Accordingly, as the peripheral edges of the contacts 144 or tabs or tines 146 move generally laterally in the X-direction as designated by the arrows, they engage the bump leads or solder balls 116 thereby scraping away any oxide coating on the tabs or tines and/or bump leads or solder balls, and exposing unoxidized metal therebeneath so as to provide an electrical connection therewith.

Another embodiment of a socket 110 providing zero insertion force is shown in FIG. 19. The socket 110 is provided with a ring-shaped contact 144 surrounding the central opening 154 having a plurality of radially inwardly extending tabs or tines 146. As shown, the tabs or tines 146 are approximately equally spaced apart, although other spacings are contemplated. The region between the tips of the tabs or tines 146 define the central opening 154 as being larger than the effective diameter or size of the bump lead or solder ball 116.

The microelectronic element 112, as shown in FIG. 20, is juxtaposed the top major surface 106 of the connector 102 and moved downwardly, i.e., in the Z-direction, so that the bump leads or solder balls 116 are received in a corresponding socket 110 with zero insertion force. Subsequently, a lateral force, i.e., in the X-direction, is applied to the microelectronic element 112 in order to move the bump leads or solder balls 116 within the sockets 110, thereby making contact by engagement with one or more of the tabs or tines 146 of each socket. The tabs or tines 146 scrape away any oxide coating on the tabs or tines and/or the bump leads or solder balls, thereby exposing unoxidized metal therebeneath to provide positive electrical connection. The tabs or tines 146 may or may not be supported by a rib 156 of dielectric layer as previously described. In addition, a generally planar spacer 162 having a plurality of openings 164 arranged in an array corresponding to the array of the bump leads or solder balls 116 may be positioned between the microelectronic element 112 and the connector 102. The spacer 162 may be in the nature of a compliant layer of dielectric material, e.g., a material such as a gel, foam, elastomer and the like.

Figure 21:
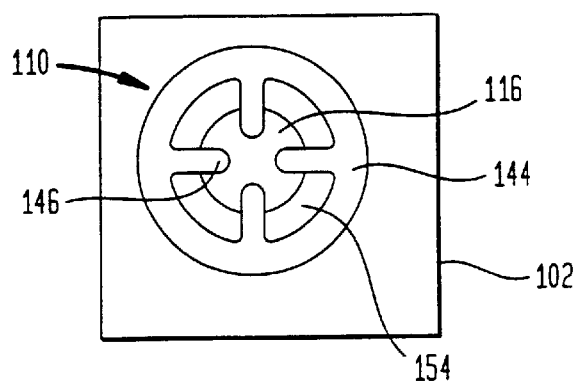
FIG. 21 is a top plan view showing a socket constructed in accordance with another embodiment of the present invention.

In another embodiment of a socket 110, as shown in FIG. 21, the radially inward extent of the tabs or tines 146 define the central opening 154 having a size smaller than the effective diameter or size of the bump lead or solder ball 116. Conversely, the effective size of the bump leads or solder balls 116 is greater than the space between the tips of the tabs or tines 146. Each of the sockets 110 includes a contact 144 in the nature of a ring provided with the plurality of radially inwardly extending tabs or tines 146. The resulting socket 110 may be used for connecting a microelectronic element 112 thereto in two alternative embodiments.

Figure 22:
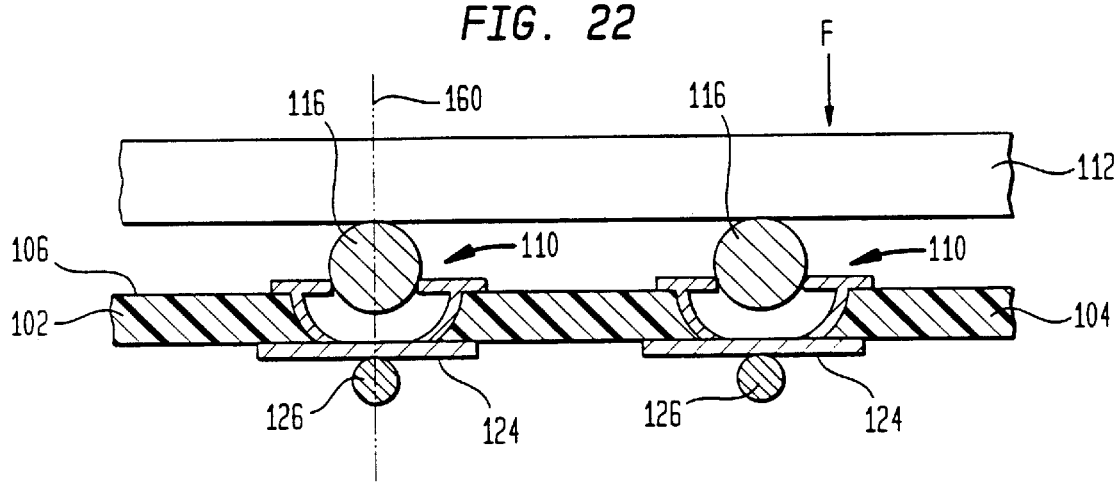
FIG. 22 is a fragmentary sectional view showing a microelectronic element mounted to a connector via the socket of FIG. 21 in accordance with one embodiment of the present invention.
Figure 23:
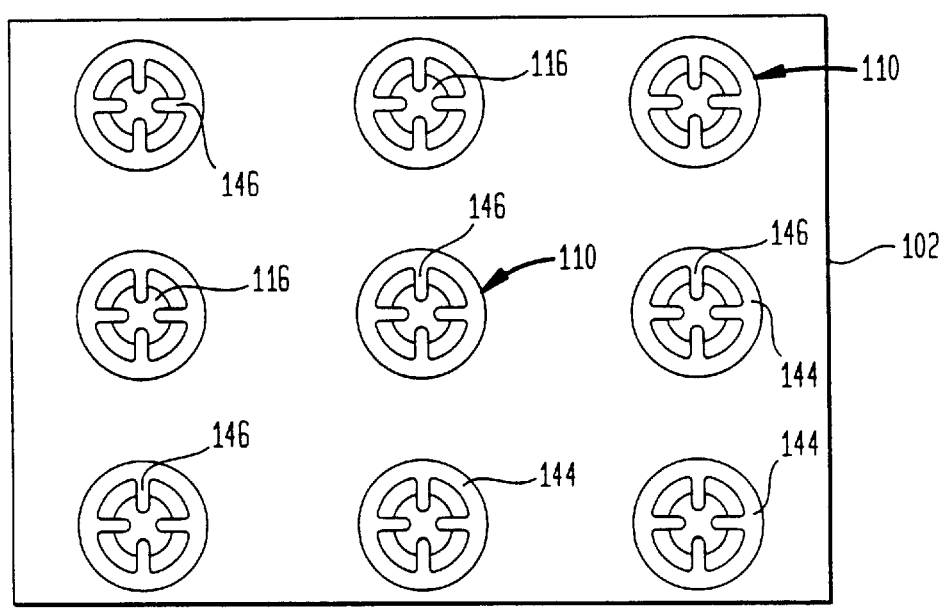
FIG. 23 is a top plan view of a connector having a plurality of the sockets of FIG. 21 arranged in a regular grid pattern.

As shown in FIG. 22, the connector 102 is supported by bump leads or solder balls 126 centrally located along the central axis 160 of the sockets 110. As the microelectronic element 112 is forced against the top major surface 106 of the connector 102, the bump leads or solder balls 116 will make contact with the tabs or tines 146 as the bump leads or solder balls are inserted into their corresponding sockets 110. As shown in FIG. 23, the sockets 110 may be provided in a regular grid array or other pattern as desired so as to accommodate the grid array of the bump leads or solder balls 116 on the microelectronic element 112.

Figure 24:
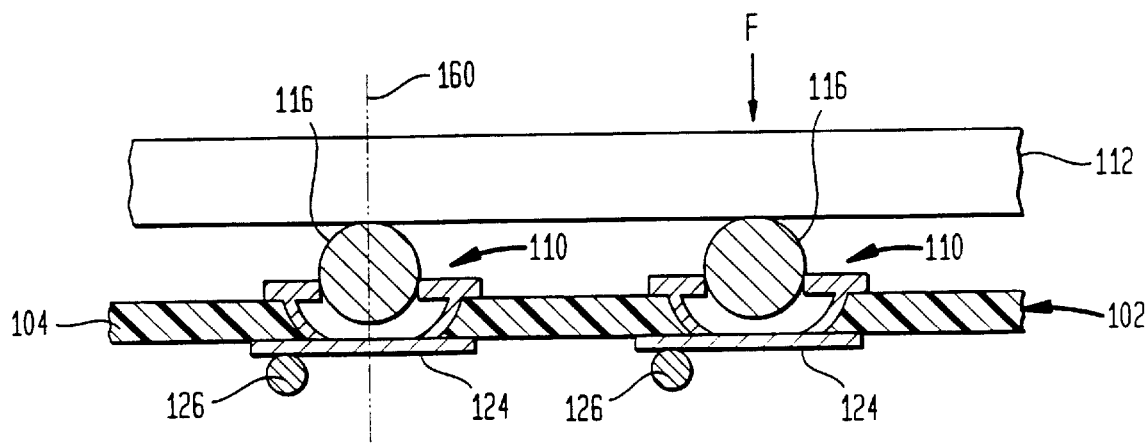
FIG. 24 is a fragmentary sectional view showing a microelectronic element mounted to a connector via the socket of FIG. 21 in accordance with another embodiment of the present invention.
Figure 25:
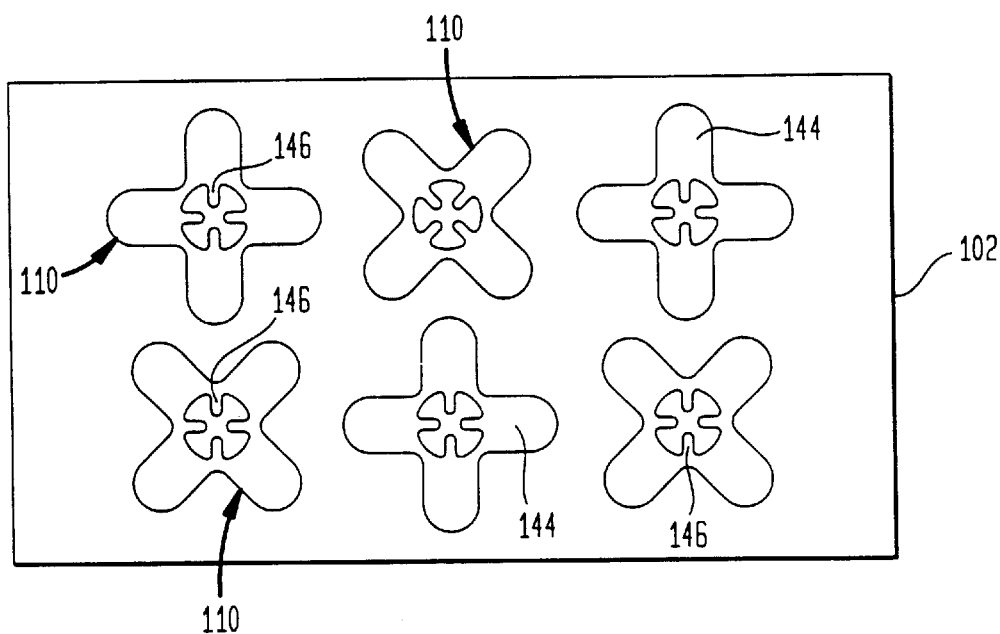
FIG. 25 is a top plan view showing various patterns of the socket contacts formed on the top surface of the connector.

The aforementioned construction and arrangement of the socket 110 can also be combined with a flexible dielectric layer 104 in order to close the tabs or tines 146 on the bump lead or solder balls 116 after insertion due to deflection of the dielectric layer and compression of the top layer of the connector 102 as shown in FIG. 24. In this embodiment, the bump lead or solder ball 126 supporting the connector 102 is arranged offset from the central axis 160 of the socket 110. The tabs or tines 146 may be less flexible or springlike in nature than those in the embodiment disclosed in FIG. 22. Various patterns of the top contacts 144 provided on the dielectric layer 104 may be used to enhance the compression of the top layer in order to cause the tabs or tines 146 to move radially inward and contact the bump leads or solder balls 116. Such patterns are shown, by way of example, in FIG. 25.

Referring now to FIG. 26 through FIG. 29, a socket 110 constructed in accordance with another embodiment of the present invention is shown. The socket 110 is constructed to include a single tab or tine 146 compared to the multiple tabs or tines previously described. A bump lead or solder ball 116 when inserted into the socket 110 may contact not only the tab or tine 146, but the edges of the contact 144 generally surrounding the central opening 154. In this regard, the central opening 154 is sized smaller than the size of the bump lead or solder ball 116. The single tab or tine 146 will deflect away from the center of the socket 110 as the bump lead or solder ball 116 is inserted into the socket.

Figure 27:
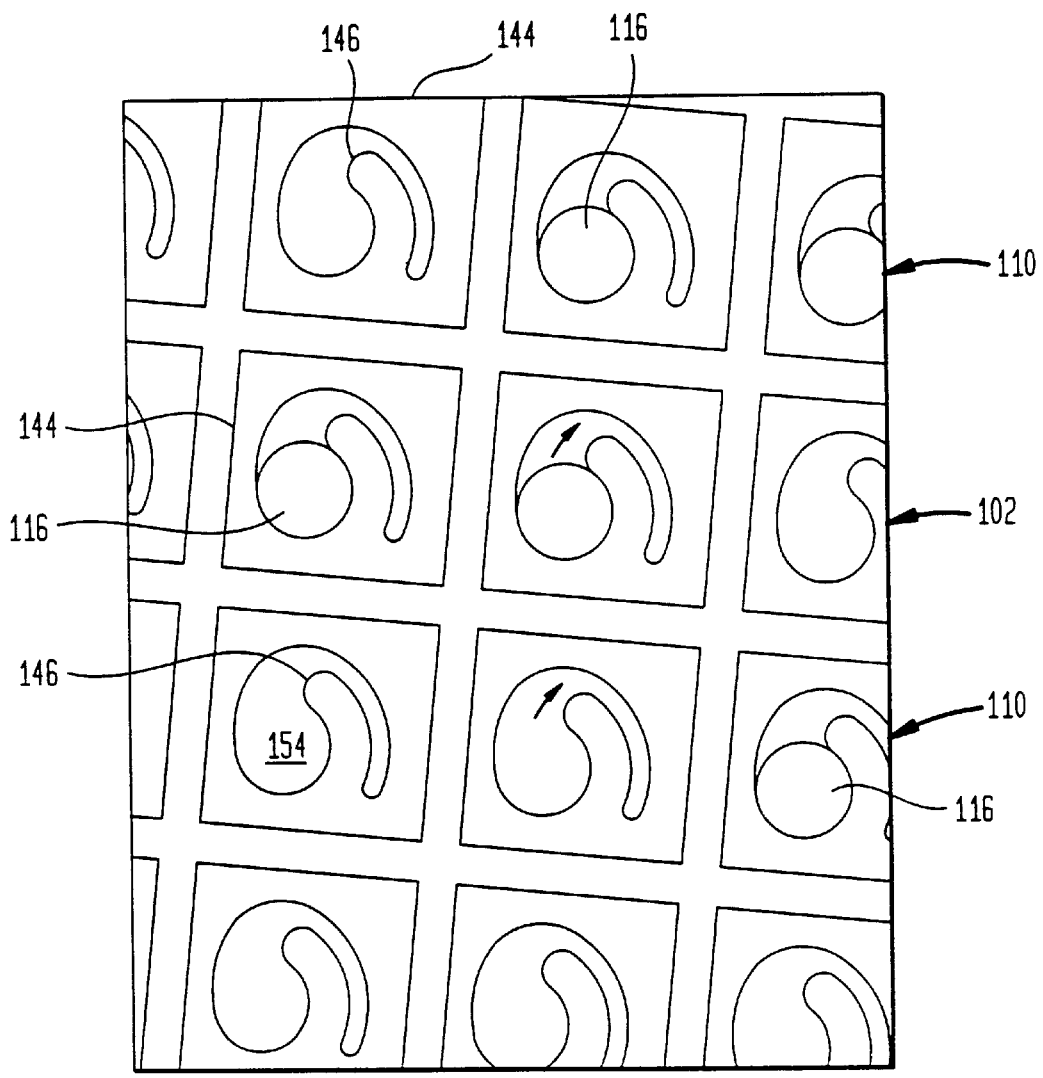
FIG. 27 is a top plan view showing a regular grid pattern of sockets shown in FIG. 26.

A top plan view of a plurality of such sockets 110 including a single tab or tine 146 arranged in a regular grid array is shown in FIG. 27. Here again, as the bump lead or solder ball 116 is inserted into the socket 110, the tab or tine 146 will scrape away oxide coating on the tab or tine and/or bump lead or solder ball, exposing unoxidized metal so as to provide positive electrical contact therewith.

Figure 28:
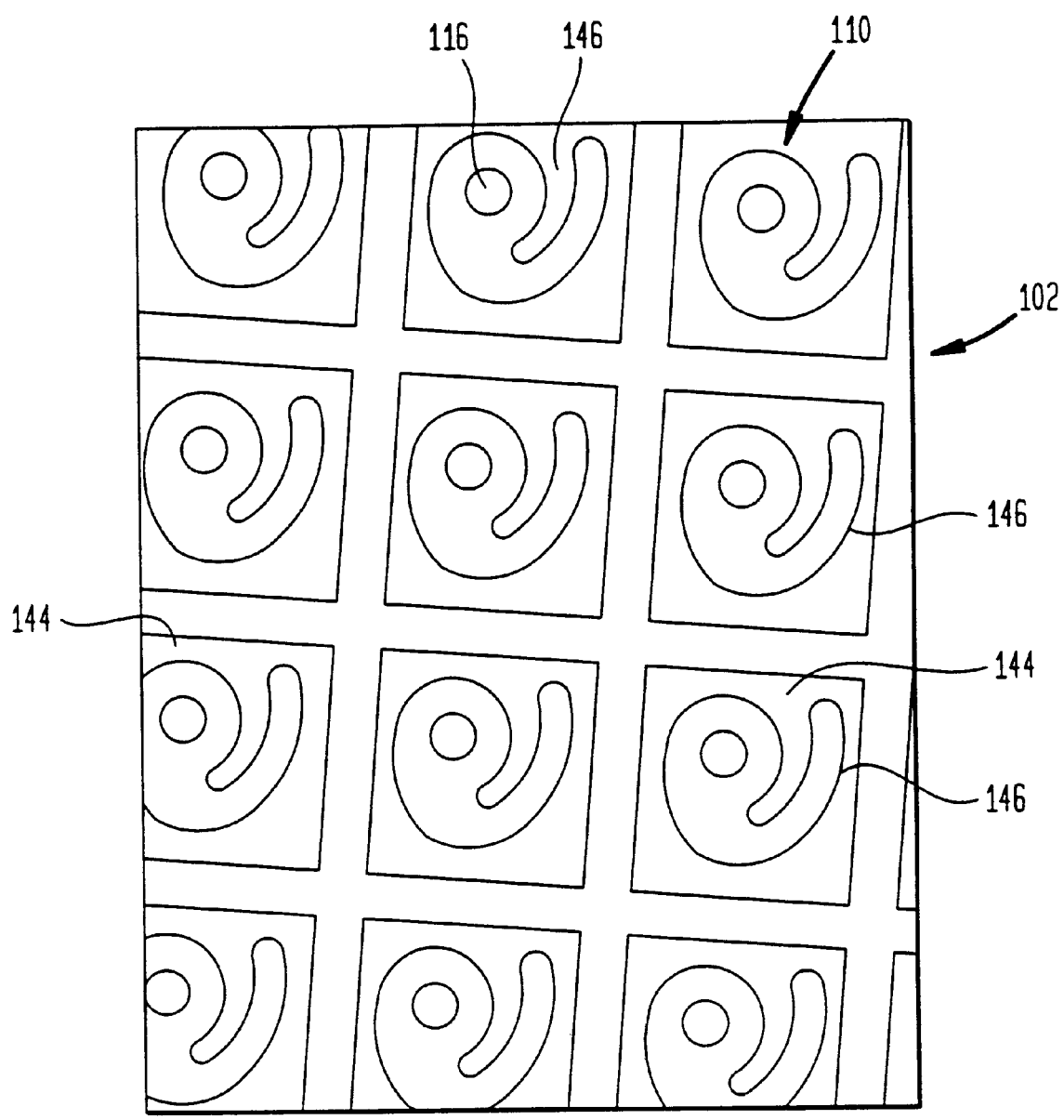
FIG. 28 is a bottom plan view showing the regular grid pattern of sockets shown in FIG. 26.

A bottom plan view of the array of sockets 110 as shown in FIG. 27 is shown in FIG. 28. As shown, the sockets 110 are not provided with a contact on the bottom surface of the dielectric layer 102 overlying the central opening 154. In this regard, the routing of electrical connection to the bump leads or solder balls 116 can be obtained by patterning the top metal layer forming the contacts 144 into circuit traces, terminals, contact pads and the like.

By providing the socket 110 with a single tab or tine 146, as opposed to dual or multiple tabs or tines as previously described, the manufacturer of a connector having a finer pitch is made possible. In addition, the simpler arrangement and construction of the socket 110 requires less photographic resolution than required in sockets having multiple tabs or tines 146, thereby permitting smaller feature sizes and increased socket density on the connector 102.

Figure 26:
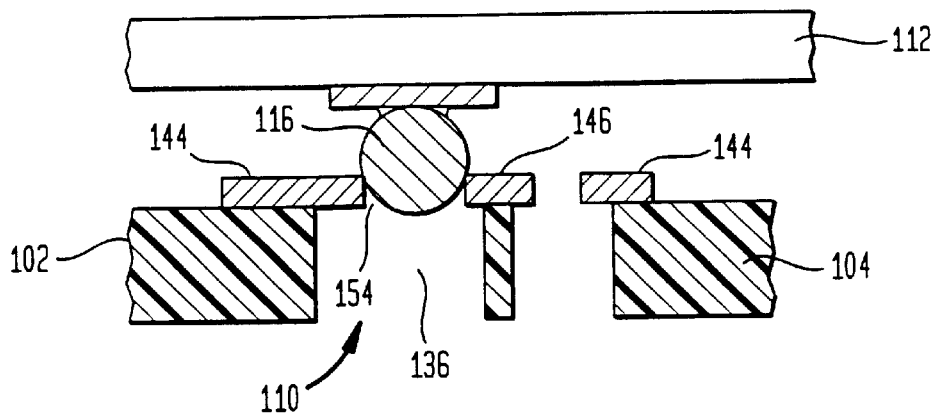
FIG. 26 is a fragmentary sectional view showing a socket constructed in accordance with another embodiment of the present invention.
Figure 29:
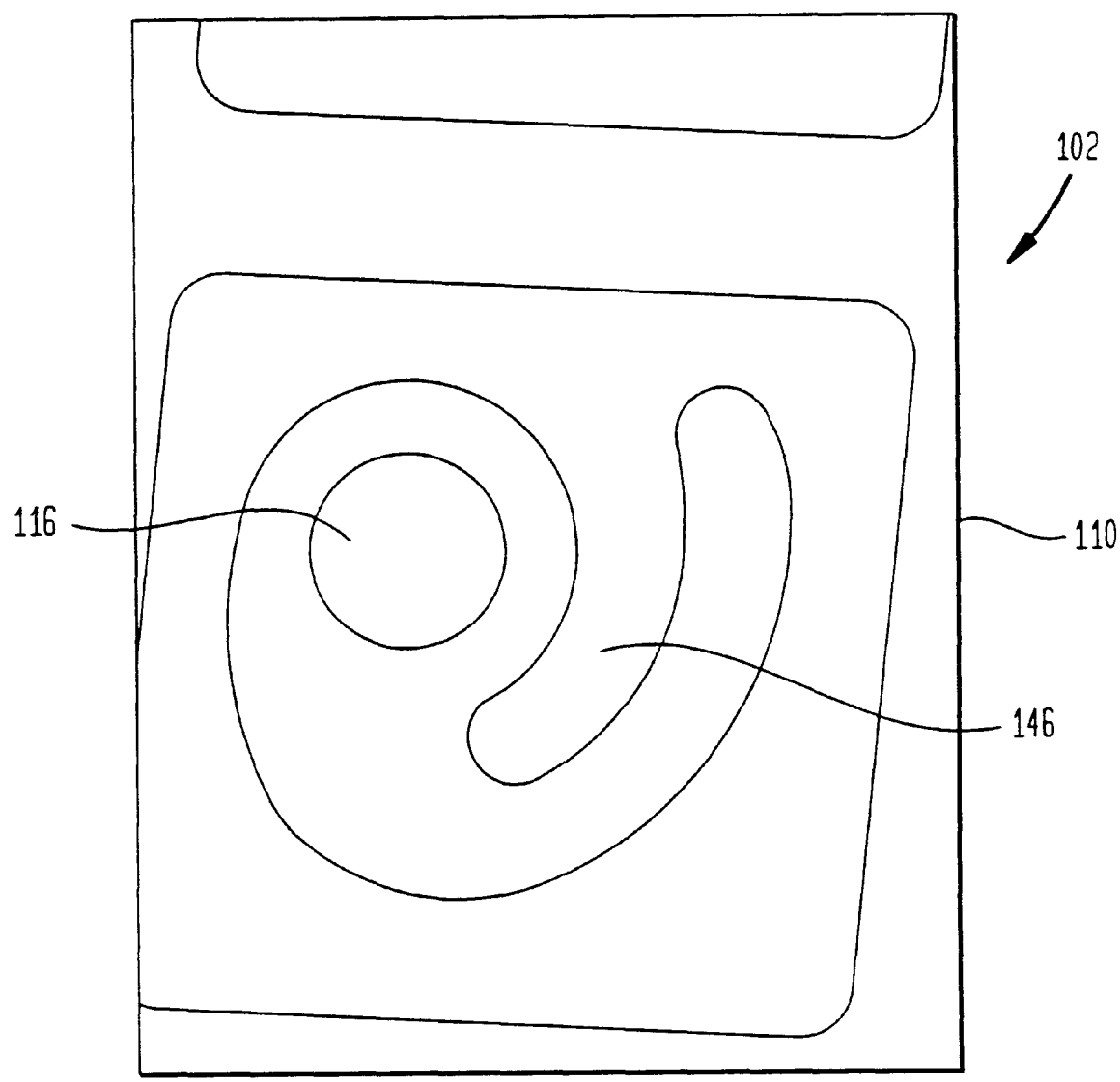
FIG. 29 is a top plan view of the socket of FIG. 26 receiving a bump lead in accordance with another embodiment of the present invention.

In the embodiment disclosed in FIGS. 26 through 28, the bump lead or solder ball 116 has an effective diameter greater than the size or effective diameter of the central opening 154. Hence, as the bump lead or solder ball 116 is forced into the socket 110, the bump lead or solder ball will engage the tab or tine 146 causing its displacement generally laterally and downwardly so as to scrape the tab or tine. In another embodiment as shown in FIG. 29, the bump lead or solder ball 116 can have an effective diameter smaller than the effective diameter or size of the central opening 154. Accordingly, the bump lead or solder ball 116 is inserted into socket 110 without contacting the tab or tine 146. By displacing the microelectronic element 112 laterally, i.e., in the X-direction, the bump lead or solder ball will contact and deflect the tab or tine while scraping same to provide electrical connection thereto. The socket 110 as thus far described is similar to the zero insertion force or side-contact as previously described. In the present embodiment, the socket 110 is provided with only a single tab or tine 146 as opposed to the multiple or dual tabs or tines previously described.

Although the invention herein has been described with reference to particular embodiments, it is to be understood that these embodiments are merely illustrative of the principles and application of the present invention. It is therefore to be understood that numerous modifications may be made to the illustrative embodiments and that other arrangements may be devised without departing from the spirit and scope of the present invention as defined by the appended claims.

What is claimed:

1. A connector for mounting a microelectronic element thereto, said connector comprising a sheetlike body having a first major surface for facing said microelectronic element and a second major surface, said body including at least one hole extending between said first and second major, surfaces, a generally laminar first contact secured to said first major surface of said body having an opening in registration with said hole, said first contact including at least one projection overlying a portion of said hole, said opening constructed for receiving a bump lead on said microelectronic element without engagement with said projection, whereby a said microelectronic element can be mounted, to said connector by superimposing said microelectronic element on said first major surface of said body so that said bump lead protrudes through said opening into said hole and upon lateral movement of said bump lead within said hole engages said projection for electrical connection thereto.

2. The connector of claim 1, further including a generally laminar second contact secured to said second major surface of said body in registration with and overlying said hole, said second contact forming said hole within a blind end adjacent said second major surface of said body, and a conductive layer lining the interior wall of said hole between said first and second contacts.

3. The connector of claim 2, further including a bump lead on said second contact in alignment with a central axis of said hole.

4. The connector of claim 2, further including a bump lead on said second contact offset from a central axis of said hole.

5. The connector of claim 1, wherein said first contact includes portions surrounding said opening overlying said hole.

6. The connector of claim 1, wherein said opening includes a central opening for receiving said bump lead therein and an adjacent opening for receiving said projection.

7. The connector of claim 6, wherein said projection comprises a pair of projections extending into said adjacent opening away from said central opening and converging towards one another.

8. The connector of claim 6, wherein said projection comprises a pair of projections extending towards said central opening away from said adjacent opening and diverging from one another.

9. The connector of claim 1, wherein said projections include a plurality of projections extending radially inwardly within said opening.

10. The connector of claim 1, wherein said body comprises a dielectric layer.

11. The connector of claim 1, wherein said projection comprises a sheetlike projection extending unsupported over said hole.

12. The connector of claim 1, wherein said projection comprises a sheetlike projection supported by a rib formed from said body within said hole.

13. The connector of claim 12, wherein said rib and said hole are lined with a metal layer in contact with said projection and said first contact.

14. The connector of claim 13, further including a generally laminar second contact secured to said second major surface overlying said hole, said second contact in electrical connection with said metal layer lining said rib and said hole.

15. The connector of claim 1, wherein said projection includes at least one bend wherein said projection has spring-like properties.

16. An electronic assembly comprising a connector constructed in accordance with claim 1, and a microelectronic element having at least one bump lead protruding therefrom and extending into said hole within said body, said microelectronic element being mounted on said first major surface of said connector upon lateral movement of said bump lead within said hole into engagement with said projection for electrical connection thereto.

17. The electronic assembly of claim 16, further including a generally laminar second contact secured to said second major surface of said body in registration with and overlying said hole, said second contact forming said hole within a blind end adjacent said second major surface of said body, and a conductive layer lining the interior wall of said hole between said first and second contacts.

18. The electronic assembly of claim 17, further including a bump lead on said second contact in alignment with a central axis of said hole.

19. The electronic assembly of claim 17, further including a bump lead on said second contact offset from a central axis of said hole.

20. The electronic assembly of claim 16, wherein said first contact includes portions surrounding said opening overlying said hole.

21. The electronic assembly of claim 16, wherein said opening includes a central opening for receiving said bump lead therein and an adjacent opening for receiving said projection.

22. The electronic assembly of claim 21, wherein said projection comprises a pair of projections extending into said adjacent opening away from said central opening and converging towards one another.

23. The electronic assembly of claim 21, wherein said projection comprises a pair of projections extending towards said central opening away from said adjacent opening and diverging from one another.

24. The electronic assembly of claim 16, wherein said projections include a plurality of projections extending radially inwardly within said opening.

25. The electronic assembly of claim 16, wherein said body comprises a dielectric layer.

26. The electronic assembly of claim 16, wherein said projection comprises a sheetlike projection extending unsupported over said hole.

27. The electronic assembly of claim 16, wherein said projection comprises a sheetlike projection supported by a rib formed from said body within said hole.

28. The electronic assembly of claim 27, wherein said rib and said hole are lined with a metal layer in contact with said projection and said first contact.

29. The electronic assembly of claim 28, further including a generally laminar second contact secured to said second major surface overlying said hole, said laminar contact in electrical connection with said metal layer lining said rib and said hole.

30. The electronic assembly of claim 16, wherein said projection includes at least one bend wherein said projection has spring-like properties.

31. The electronic assembly of claim 16, further including a spacer positioned between said microelectronic element and said first major surface of said body.

* * * * *